(12) United States Patent
Kim

(10) Patent No.: US 7,803,691 B2
(45) Date of Patent: Sep. 28, 2010

(54) NONVOLATILE MEMORY DEVICE AND METHOD FOR FABRICATING THE SAME

(75) Inventor: Jae-Hong Kim, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 6 days.

(21) Appl. No.: 11/965,599

(22) Filed: Dec. 27, 2007

(65) Prior Publication Data

US 2008/0277714 A1 Nov. 13, 2008

(30) Foreign Application Priority Data

May 9, 2007 (KR) ...................... 10-2007-0045015

(51) Int. Cl.
*H01L 21/762* (2006.01)
*H01L 27/088* (2006.01)

(52) U.S. Cl. ................. 438/424; 257/321; 257/E27.06; 257/E27.549

(58) Field of Classification Search ................. 257/639; 438/424

See application file for complete search history.

(56) References Cited

U.S. PATENT DOCUMENTS

2002/0019113 A1* 2/2002 Chung ......................... 438/424
2005/0233524 A1* 10/2005 Lee ............................. 438/264
2006/0292781 A1* 12/2006 Lee ............................. 438/197
2007/0059888 A1* 3/2007 Sukekawa .................... 438/279
2007/0063263 A1* 3/2007 Oh et al. ...................... 257/316
2007/0202657 A1* 8/2007 Sun et al. ..................... 438/396

FOREIGN PATENT DOCUMENTS

KR 1020030001912 A 1/2003
KR 1020070004351 A 1/2007

* cited by examiner

*Primary Examiner*—Wael Fahmy
*Assistant Examiner*—Lawrence Tynes, Jr.
(74) *Attorney, Agent, or Firm*—Townsend and Townsend and Crew LLP

(57) ABSTRACT

A nonvolatile memory device includes a control gate formed along a first direction over a substrate, an active region formed over the substrate, the active region being defined along a second direction crossing the control gate and including a fin type protruding portion having rounded top corners at a region where the control gate and the active region overlap, a floating gate formed over a surface of the protruding portion of the active region below the control gate and formed to a substantially uniform thickness along the surface profile of the protruding portion of the active region, a tunneling insulation layer formed between the floating gate and the active region, and a dielectric layer formed between the floating gate and the control gate.

24 Claims, 11 Drawing Sheets

_US 7,803,691 B2_

NONVOLATILE MEMORY DEVICE AND METHOD FOR FABRICATING THE SAME

CROSS-REFERENCE TO RELATED APPLICATIONS

The present invention claims priority of Korean patent application number 2007-0045015, filed on May 9, 2007, which is incorporated by reference in its entirety.

BACKGROUND OF THE INVENTION

The present invention relates to a method for fabricating a semiconductor device, and more particularly, to a method for fabricating a nonvolatile memory device.

Recently, research on high-integration memory device technology has been actively conducted to develop high capacity memory devices which can electrically program and erase, and store a large amount of data. However, if the design rule is decreased for high-integration, the channel length of a device may shorten, causing the threshold voltage (Vt) to decrease.

Thus, the doping concentration level of threshold voltage adjusting ions has to be increased to compensate the lowered threshold voltage. However, the increased doping concentration level of the ions implanted in the substrate may cause an increased electric field between source and drain, increased junction leakage current, and a short channel effect (SCE) inducing drain induced barrier lowering (DIBL).

The most basic method for reducing a short channel effect is to reduce a substrate doping concentration level or lengthen the channel length.

FIG. 1 illustrates a top view of a typical nonvolatile memory device. FIG. 2 illustrates a cross-sectional view of the nonvolatile memory device shown in FIG. 1 in accordance with a line A-A'. FIG. 3 illustrates a cross-sectional view of the nonvolatile memory device shown in FIG. 1 in accordance with a line B-B'.

Referring to FIG. 1, a plurality of isolation structures 11 are formed in a substrate 10 with a uniform spacing distance along one direction. Control gates 15 are formed in a perpendicular direction to the isolation structures 11.

The control gates 15 are formed to cover floating gates 14. The floating gates 14 are formed over active regions 10A between the isolation structures 11.

The floating gates 14 are formed over the active regions 10A below the control gates 15. Also, portions of the floating gates 14 are extended over the isolation structures 11 adjacent to the active regions 10A in order to secure the coupling ratio.

Referring to FIGS. 2 and 3, a plurality of the isolation structures 11 having a trench structure are formed in the substrate 10 with a uniform spacing distance to define the active regions 10A.

The control gates 15 are formed over the substrate 10, across the active regions 10A. A tunnel oxide-based layer 12 and the floating gates 14 are stacked over the active regions 10A below the control gates 15 and portions of the adjacent isolation structures 11. An oxide/nitride/oxide (ONO) layer 13 is formed between the floating gates 14 and the control gates 15.

The typical nonvolatile memory device includes a planar gate structure where gates configured from the floating gates 14 and the control gates 15 are formed over the planar active regions 10A.

However, an effective channel length CH1 is determined by the line width of the floating gates 14 in the typical planar gate structure. Thus, a short channel effect may increase, causing difficulty in highly integrating the nonvolatile memory device.

SUMMARY OF THE INVENTION

Embodiments of the present invention are directed to provide a nonvolatile memory device and a method for fabricating the same, which can increase an effective channel length to secure an electric characteristic of the device.

In accordance with a first embodiment of the present invention, there is provided a nonvolatile memory device including a control gate formed along a first direction over a substrate, an active region formed over the substrate, the active region being defined along a second direction crossing the control gate and including a fin type protruding portion having rounded top corners at a region where the control gate and the active region overlap, a floating gate formed over a surface of the protruding portion of the active region below the control gate and formed to a substantially uniform thickness along the surface profile of the protruding portion of the active region, a tunneling insulation layer formed between the floating gate and the active region, and a dielectric layer formed between the floating gate and the control gate.

In accordance with a second embodiment of the present invention, there is provided a method for fabricating a nonvolatile memory device. The method includes forming isolation structures to define active regions, recessing portions of the isolation structures so that the active regions protrude above the isolation structures, rounding top corners of the protruding active regions, forming tunneling insulation layers over surfaces of the protruding active regions, forming floating gate layers to a substantially uniform thickness over the tunneling insulation layers along the surface profile of the protruding active regions, forming a dielectric layer and a control gate layer over a substrate structure, forming gate masks over the control gate layer along a direction crossing the active regions, and etching the control gate layer, the dielectric layer, the floating gate layers, the tunneling insulation layers, and the protruding active regions using the gate masks, exposing the recessed isolation structures, to form protruding fin type active regions and form gates over the protruding fin type active regions.

DESCRIPTION OF SPECIFIC EMBODIMENTS

Figure 1:
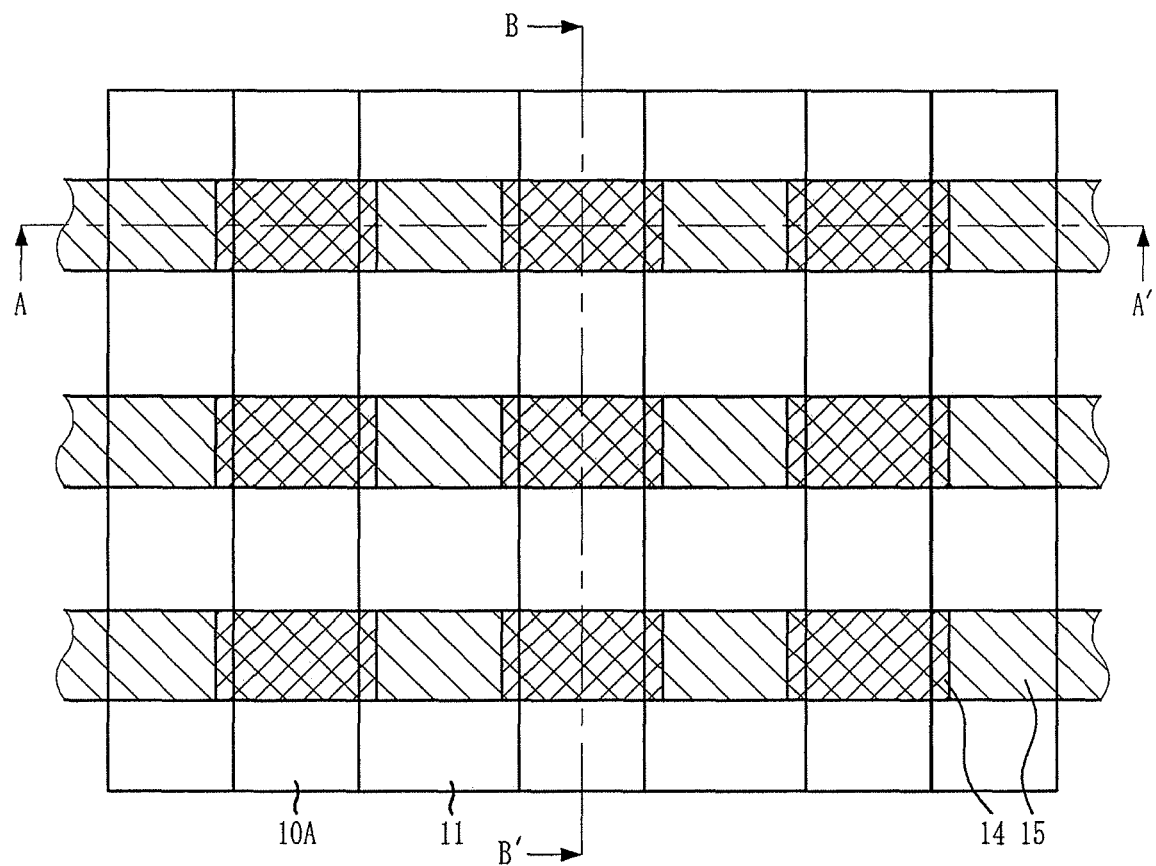
FIG. 1 illustrates a top view of a typical nonvolatile memory device.
Figure 2:
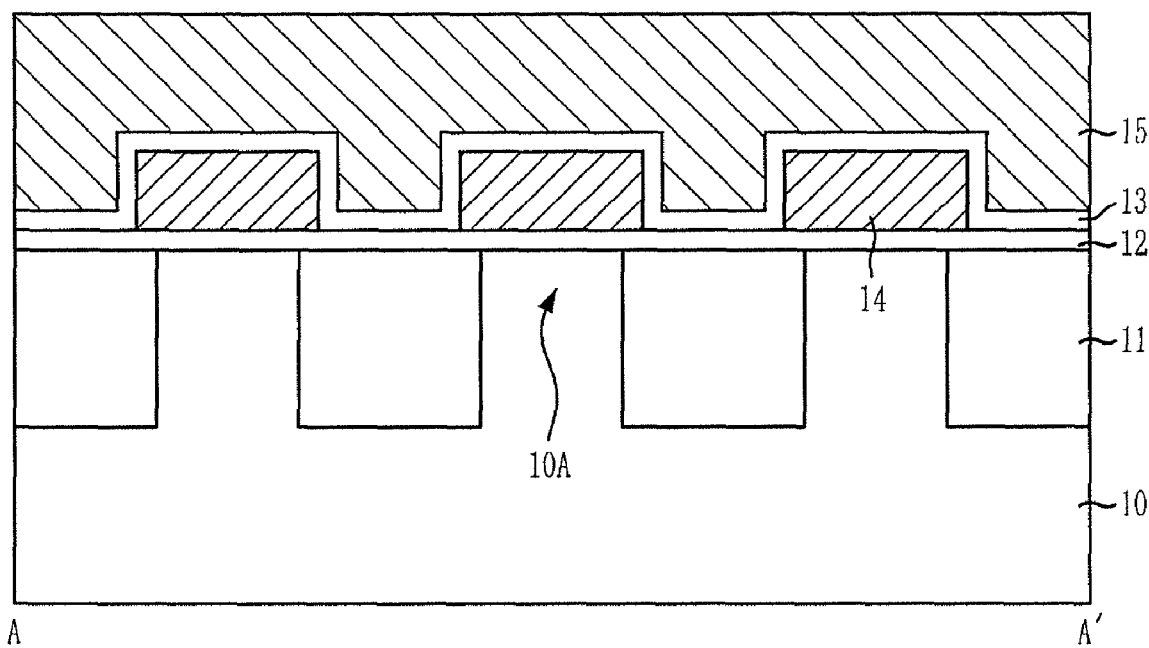
FIG. 2 illustrates a cross-sectional view of the nonvolatile memory device shown in FIG. 1 in accordance with a line A-A'.

Embodiments of the present invention relate to a nonvolatile memory device and a method for fabricating the same.

Referring to the drawings, the illustrated thickness of layers and regions are exaggerated to facilitate explanation. When a first layer is referred to as being "on" a second layer or "on" a substrate, it could mean that the first layer is formed directly on the second layer or the substrate, or it could also mean that a third layer may exist between the first layer and the substrate. Furthermore, the same or like reference numerals throughout the various embodiments of the present invention represent the same or like elements in different drawings.

Figure 4:
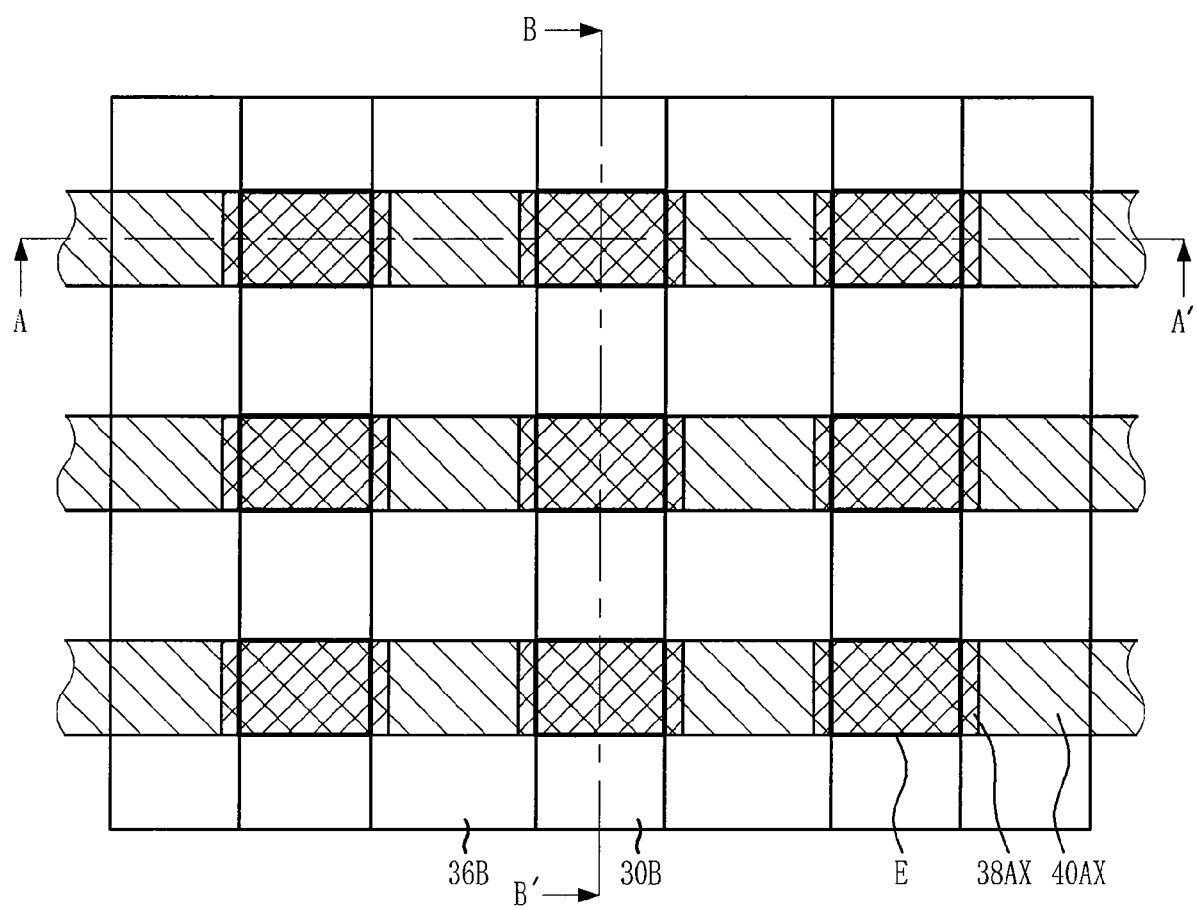
FIG. 4 illustrates a top view of a nonvolatile memory device in accordance with an embodiment of the present invention.
Figure 5:
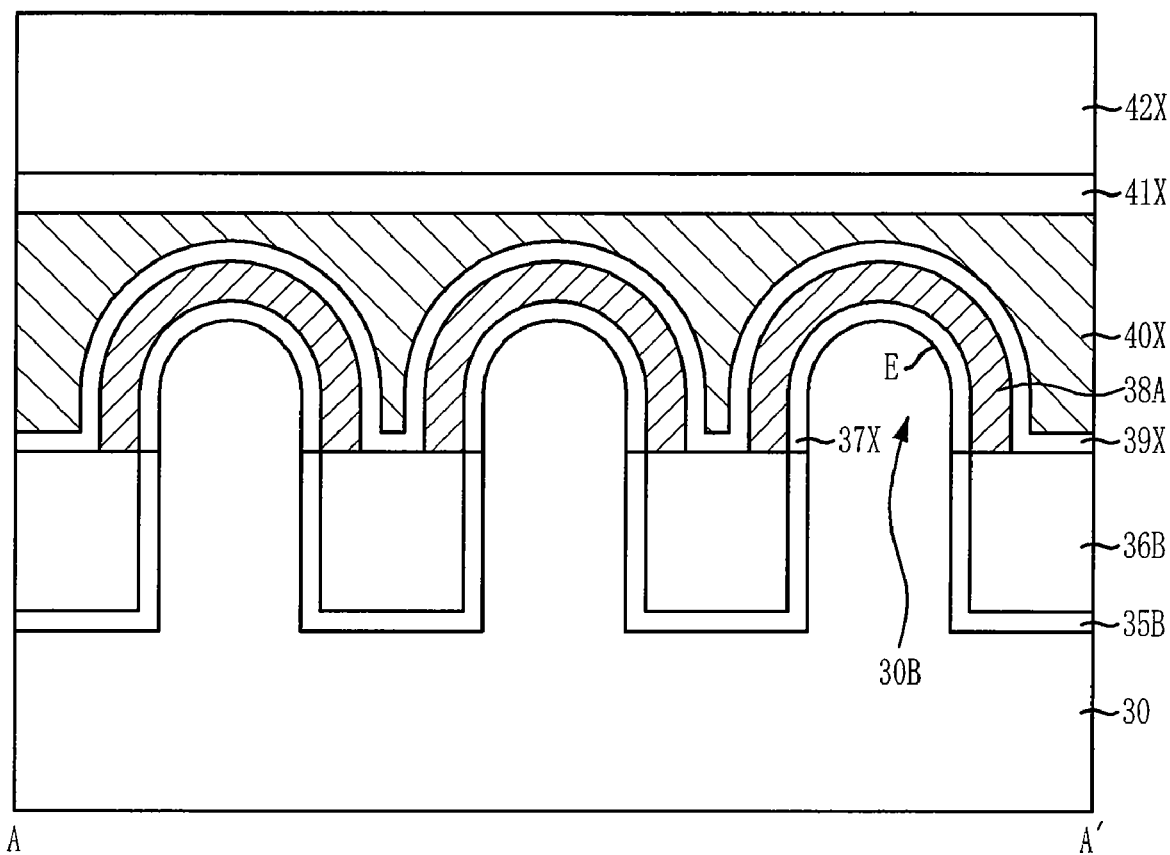
FIG. 5 illustrates a cross-sectional view of the nonvolatile memory device shown in FIG. 4 in accordance with a line A-A'.
Figure 6:
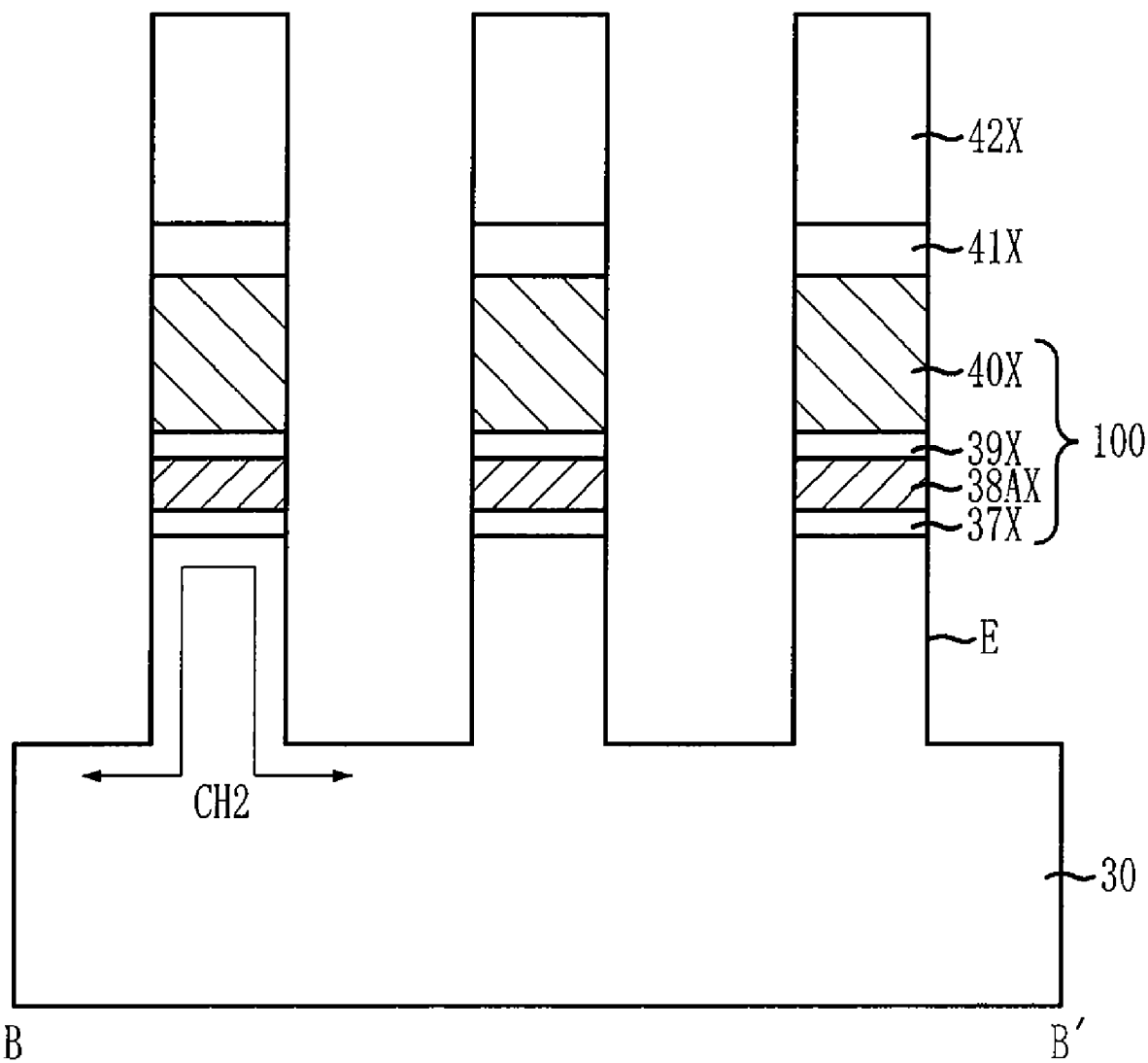
FIG. 6 illustrates a cross-sectional view of the nonvolatile memory device shown in FIG. 4 in accordance with a line B-B'.

FIG. 4 illustrates a top view of a nonvolatile memory device in accordance with an embodiment of the present invention. FIG. 5 illustrates a cross-sectional view of the nonvolatile memory device shown in FIG. 4 in accordance with a line A-A'. FIG. 6 illustrates a cross-sectional view of the nonvolatile memory device shown in FIG. 4 in accordance with a line B-B'.

Referring to FIGS. 4 to 6, rounded active regions 30B below control gates 40X protrude in a fin structure. Reference denotation E represent protruding portions E of the rounded active regions 30B. Gates 100 are formed over the protruding portions E. The gates 100 include tunneling insulation patterns 37X, floating gates 38AX, dielectric patterns 39X, and the control gates 40X.

In FIG. 4, borderlines of the protruding portions E of the rounded active regions 30B are illustrated with thick lines to distinguish the protruding portions E of the rounded active regions 30B from non-protruding portions.

In more detail, a plurality of remaining isolation structures 36B having a shallow trench isolation (STI) structure are formed in a substrate 30 along a first direction to define the rounded active regions 30B. The rounded active regions 30B include the protruding portions E in a fin structure having rounded top corners protruding above upper surfaces of the remaining isolation structures 36B.

Meanwhile, the control gates 40X are formed along a second direction across the rounded active regions 30B over the substrate 30. The second direction is perpendicular to the first direction. The protruding portions E are formed in regions where the control gates 40X and the rounded active regions 30B overlap.

The protruding portions E are formed in a fin structure. That is, the protruding portions E are formed at portions where the rounded active regions 30B overlap with the control gates 40X, but are not formed at other portions of the rounded active regions 30B which do not overlap with the control gates 40X. The non-protruding portions of the rounded active regions 30B have substantially the same surface height as that of the remaining isolation structures 36B.

The floating gates 38AX having a uniform thickness are formed over the protruding portions E below the control gates 40X. The floating gates 38AX are formed along the surface profile of the protruding portions E.

The floating gates 38AX are insulated from adjacent floating gates 38AX formed along the second direction (i.e., in the direction along the control gates 40X) by the remaining isolation structures 36B.

The rounded active regions 30B and the floating gates 38AX are insulated from each other by the tunneling insulation patterns 37X. The floating gates 38AX and the control gates 40X are insulated from each other by the dielectric patterns 39X.

Reference numeral 35B represents remaining wall oxide layers 35B which are formed after a trench etching is performed for forming the remaining isolation structures 36B. Also, reference numerals 41X and 42X represent silicon oxynitride (SiON) patterns 41X and hard masks 42X for gate etching, respectively. A method for fabricating a nonvolatile memory device having the above described structure is illustrated as follows.

FIGS. 7A to 7H illustrate cross-sectional views of a method for fabricating a nonvolatile memory device in accordance with an embodiment of the present invention.

The cross-sectional views shown in FIGS. 7A to 7G are sectional views of the nonvolatile memory device shown in FIG. 4 taken along the A-A' line. The cross-sectional view shown in FIG. 7H is a sectional view of the nonvolatile memory device shown in FIG. 4 taken along the B-B' line.

Figure 7A:
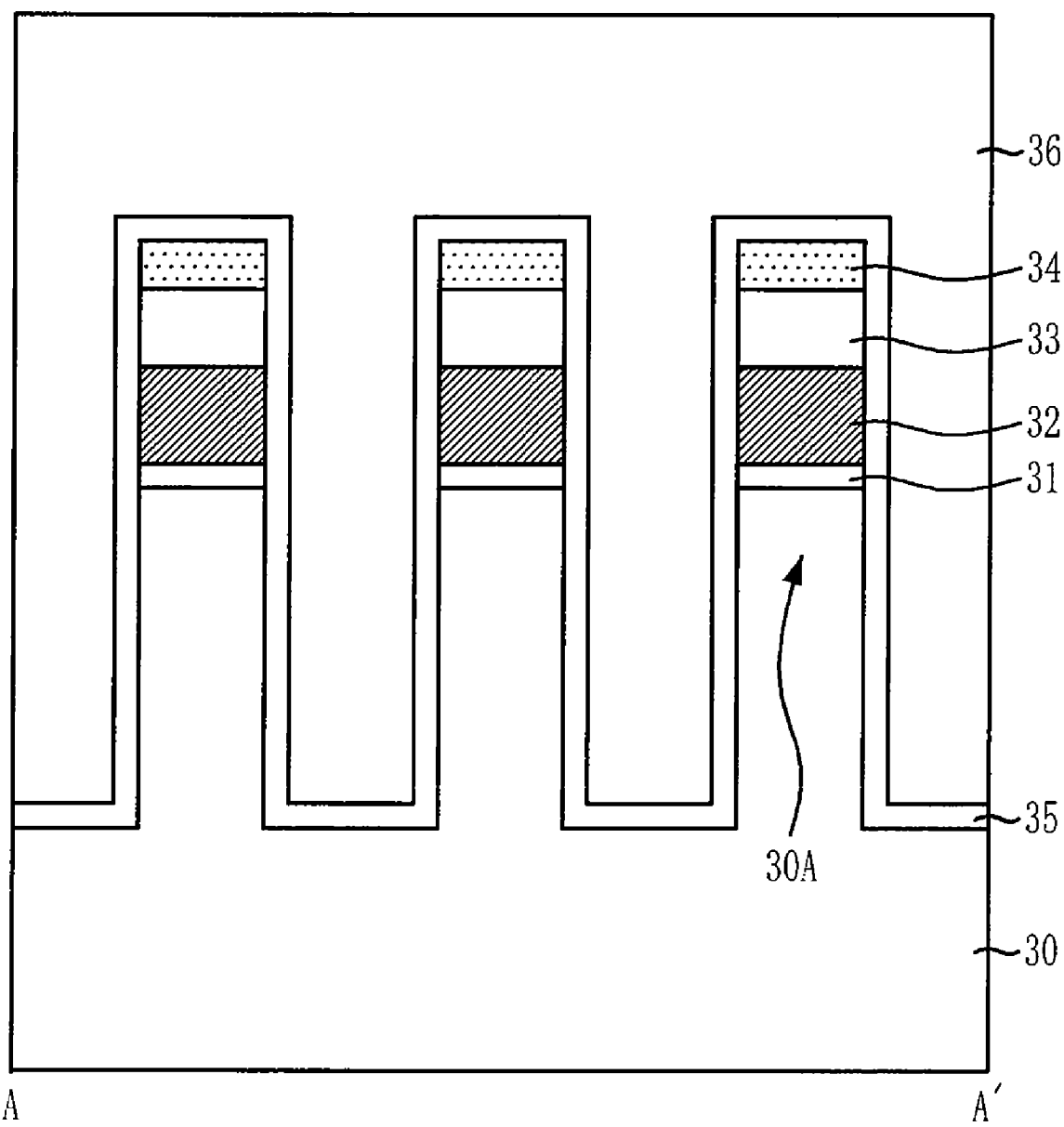
FIGS. 7A to 7H illustrate cross-sectional views of a method for fabricating a nonvolatile memory device in accordance with an embodiment of the present invention.

Referring to FIG. 7A, threshold voltage (Vt) screen oxide layers 31, ISO nitride layers 32, ISO oxide layers 33, and ISO hard masks 34 are formed over a substrate 30.

In more detail, a Vt screen oxide-based layer, an ISO nitride-based layer, an ISO oxide-based layer, and an ISO hard mask layer are formed over the substrate 30, on which a shallow trench isolation (STI) process will be performed.

The Vt screen oxide-based layer includes a thermal oxide layer. The Vt screen oxide-based layer is formed to a thickness ranging from approximately 50 Å to approximately 100 Å in a diffusion furnace at a temperature of approximately 900° C. in an oxygen ambience.

The ISO nitride-based layer is formed to a thickness of approximately 500 Å. The ISO nitride-based layer is formed at a temperature of approximately 760° C. and a pressure of approximately 0.35 Torr using nitrogen ($N_2$) flowing at a rate of approximately 50 sccm, dichlorosilane ($SiH_2Cl_2$) flowing at a rate of approximately 90 sccm, and ammonia ($NH_3$) flowing at a rate of approximately 90 sccm.

The ISO oxide-based layer is formed to a thickness of approximately 300 Å. The ISO hard mask layer includes a SiON layer formed to a thickness of approximately 300 Å.

A photo etch process is performed to pattern the ISO hard mask layer. The ISO oxide-based layer, the ISO nitride-based layer, and the Vt screen oxide-based layer are etched using the patterned ISO hard mask layer as an etch mask.

Portions of the substrate 30 are exposed after the Vt screen oxide-based layer is etched. The exposed portions of the substrate 30 are etched to a given depth to form trenches for isolation. Thus, regions other than the trenches are defined as active regions 30A. Consequently, the threshold voltage (Vt) screen oxide layers 31, the ISO nitride layers 32, the ISO oxide layers 33, and the ISO hard masks 34 are formed over the substrate 30.

The trenches are formed to a depth of approximately 2,000 Å. The trenches are etched using a dry etch method. The trenches are formed by etching from the ISO hard mask layer to the substrate 30 in-situ.

The etch process for forming the trenches uses an etch gas including a fluorine-based gas. The fluorine-based gas includes one of tetrafluoromethane ($CF_4$), hexafluoroethane ($C_2F_6$), octafluorocyclobutane ($C_4F_8$), $C_4F_6$, $C_5F_8$, fluoroform ($CF_3H$), difluoromethane ($CF_2H_2$), methyl fluoride ($CFH_3$), pentafluoroethane ($C_2HF_5$), nitrogen trifluoride ($NF_3$), sulfur hexafluoride ($SF_6$), and chlorotrifluoromethane ($CF_3Cl$). Also, an additive gas including hydrogen ($H_2$) or oxygen ($O_2$) is added to the etch gas.

A wall oxide-based layer 35 and a liner oxide-based layer (not shown) are formed over the resultant substrate structure. A gap-fill insulation layer is formed over the substrate structure and filled in the trenches. For instance, a high density plasma (HDP) oxide-based layer 36 is formed.

The wall oxide-based layer 35 is formed to a thickness ranging from approximately 50 Å to approximately 100 Å. The HDP oxide-based layer 36 including the liner oxide-based layer is formed in an optimum manner which allows isolation without dishing or erosion in a cell region and a peripheral region during a subsequent chemical mechanical polishing (CMP) process. For instance, the HDP oxide-based layer 36 is formed to a thickness ranging from approximately 5,000 Å to approximately 8,000 Å.

After the HDP oxide-based layer 36 is formed, an annealing process is performed in a nitrogen ambience at a temperature of approximately 1,050° C. for approximately 30 minutes or longer to densify the layer property.

Figure 7B:
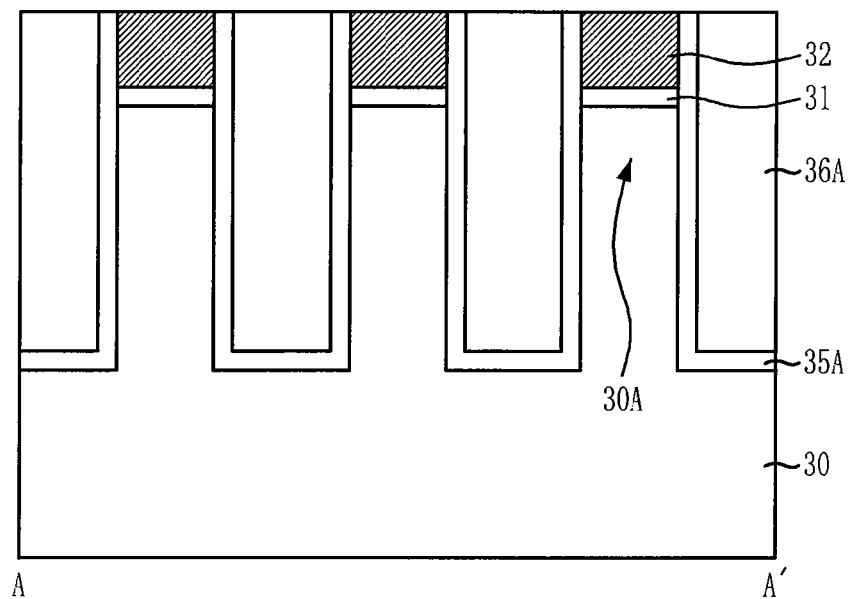

Referring to FIG. 7B, a CMP process using silica slurry is performed to remove large height differences over the active regions 30A. Another CMP process using ceria slurry is performed to improve uniformity of the HDP oxide-based layer 36 in the cell region and the peripheral region. Thus, isolation structures 36A are formed. Reference numeral 35A represents wall oxide layers 35A.

During the CMP processes, the ceria slurry has a higher polish selectivity of the ISO nitride layers 32 including a silicon nitride layer when compared to the HDP oxide-based layer 36, but is far less capable of removing height differences than the silica slurry.

Thus, the HDP oxide-based layer 36 is partially planarized by the silica slurry in advance to remove height differences before using the ceria slurry. The HDP oxide-based layer 36 is then divided into the isolation structures 36A using the ceria slurry which is a high selectivity slurry.

The ISO nitride layers 32 function as a polish stop layer during the two CMP processes. Thus, the HDP oxide-based layer 36, the ISO hard masks 34, and the ISO oxide layers 33 are polished during the CMP processes.

Figure 7C:
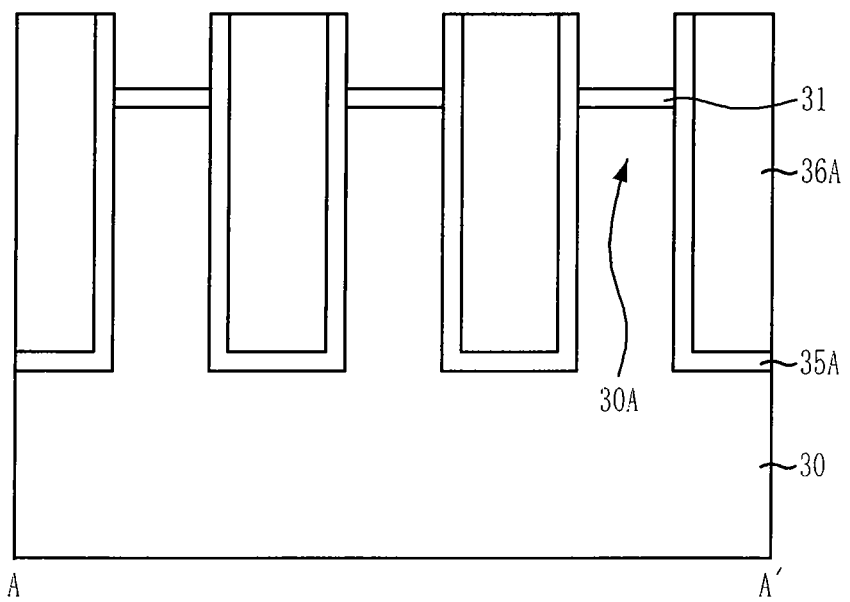

Referring to FIG. 7C, the ISO nitride layers 32 remaining after the planarization of the isolation structures 36A are removed. The ISO nitride layers 32 are dipped in a buffered oxide etchant (BOE) solution to remove residues of the HDP oxide-based layer 36 possibly remaining over the ISO nitride layers 32, before removing the ISO nitride layers 32. The ISO nitride layers 32 are then removed using phosphoric acid ($H_3PO_4$) solution.

Figure 7D:
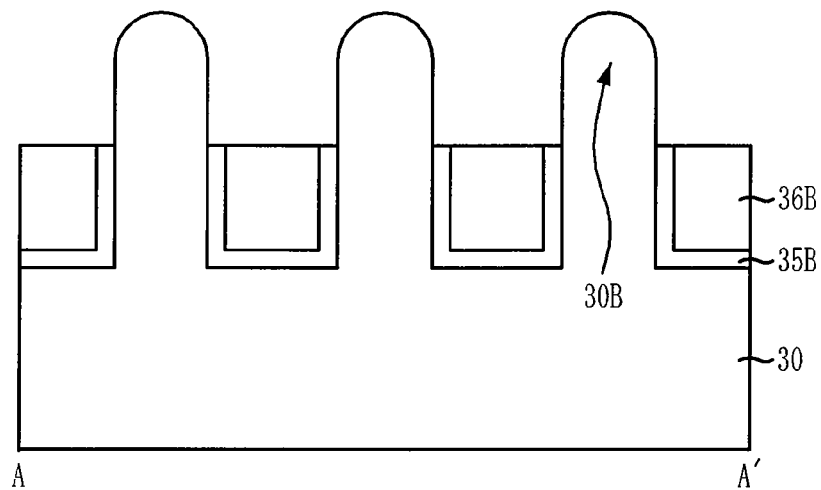

Referring to FIG. 7D, a certain thickness of the isolation structures 36A formed between the active regions 30A is recessed to protrude upper portions of the active regions 30A. At this time, the recessed thickness of the isolation structures 36A ranges from approximately 500 Å to approximately 1,500 Å. The isolation structures 36A are recessed using a dry etch process.

Portions of the Vt screen oxide layers 31 remaining over the active regions 30A and the wall oxide layers 35A formed on sides of the isolation structures 36A are removed during the dry etch process.

A top corner rounding (TCR) process is performed to round top corners of the protruded active regions 30A. Thus, electric field strongly forming at the top corners of the active regions 30A is avoided. For instance, the TCR process includes a cleaning process. Reference numeral 30B represents rounded active regions 30B.

After the TCR process, regions where residues of the Vt screen oxide layers 31 and the wall oxide layers 35A remain and other regions where the Vt screen oxide layers 31 and the wall oxide layers 35A are removed coexist over the upper and side portions of the rounded active regions 30B.

The residues of the Vt screen oxide layers 31 and the wall oxide layers 35A are sufficiently removed using a wet cleaning process. Reference numerals 35B and 36B represent remaining wall oxide layers 35B and remaining isolation structures 36B, respectively.

Figure 7E:
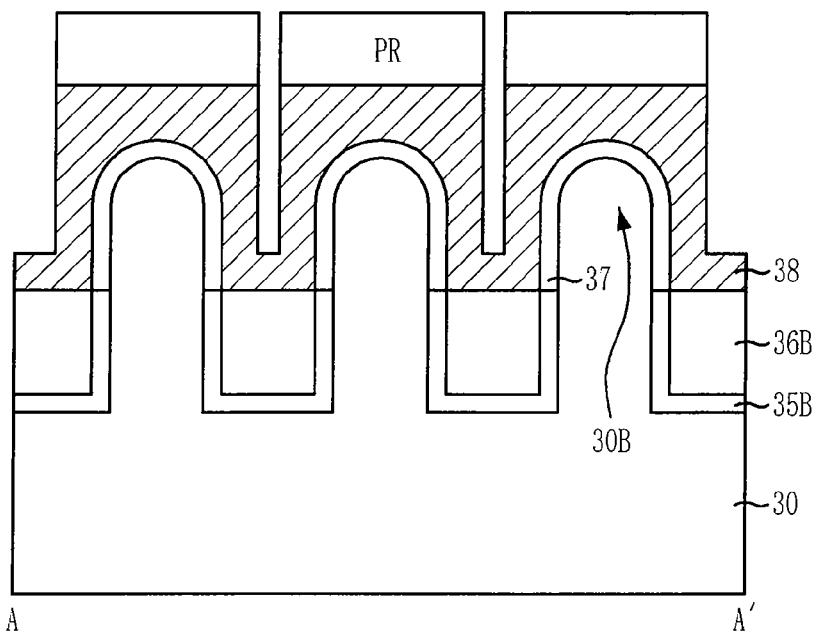

Referring to FIG. 7E, tunneling insulation layers 37 are formed in a conformal manner over the surfaces of the rounded active regions 30B. An etched floating gate layer 38 is formed over the substrate structure. A photoresist pattern PR is formed over the etched floating gate layer 38.

In more detail, a floating gate layer is formed over the tunneling insulation layers 37. For instance, the tunneling insulation layers 37 are formed to a thickness ranging from approximately 50 Å to approximately 100 Å, and the floating gate layer includes a polysilicon layer formed to a thickness ranging from approximately 1,500 Å to approximately 2,000 Å.

The photoresist pattern PR is formed to cover certain portions of the floating gate layer. The certain portions of the floating gate layer are formed over the rounded active regions 30B and portions of the remaining isolation structures 36B adjacent to the rounded active regions 30B.

A partial etch process is performed on the floating gate layer. That is, portions of the floating gate layer are etched using the photoresist pattern PR as a mask in a manner that the floating gate layer remains over the remaining isolation structures 36B with a certain thickness.

After the partial etch process, portions of the floating gate layer remaining over the remaining isolation structures 36B have a thickness ranging from approximately 500 Å to approximately 1,000 Å. Thus, the etched floating gate layer 38 is formed.

Figure 7F:
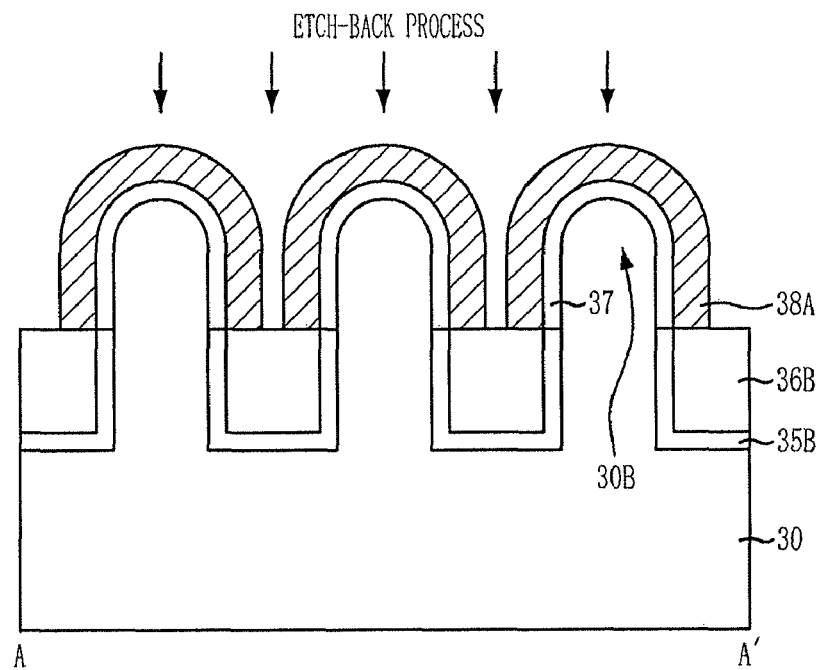

Referring to FIG. 7F, the photoresist pattern PR is removed. A dry etch-back process is performed on the etched floating gate layer 38 to expose portions of the remaining isolation structures 36B.

The dry etch-back process uses an etch gas including a fluorine-based gas. The fluorine-based gas includes one of $CF_4$, $C_2F_6$, $C_4F_8$, $C_4F_6$, $C_5F_8$, $CF_3H$, $CF_2H_2$, $CFH_3$, $C_2HF_5$, $NF_3$, $SF_6$, and $CF_3Cl$. Also, an additive gas including $H_2$ or $O_2$ is added to the etch gas.

Consequently, the etched floating gate layer 38 is divided over the remaining isolation structures 36B. Reference numeral 38A represents remaining floating gate layers 38A. The remaining floating gate layers 38A are formed to a uniform thickness along the rounded surface profile of the rounded active regions 30B.

The remaining floating gate layers 38A are formed to a uniform thickness along the surface profile of the rounded active regions 30B because a coupling voltage between floating gates and control gates may not be uniformly maintained if the thickness of the remaining floating gate layers 38A is non-uniform.

That is, efficiency of the fin type channel formed in this embodiment may be maximized by forming the remaining floating gate layers 38A to a uniform thickness along the rounded surface profile of the rounded active regions 30B and uniformly maintaining charge density and electric fields during device operations.

In this embodiment illustrated with the drawings, the floating gate layer is partially etched using the photoresist pattern PR as a mask to form the etched floating gate layer 38, and the dry etch-back process is performed to divide the etched floating gate layer 38 over the remaining isolation structures 36B while forming the remaining floating gate layers 38A to a uniform thickness along the surface profile of the rounded active regions 30B.

However, during the etch process using the photoresist pattern PR, instead of partially etching the floating gate layer, the floating gate layer may be fully etched so that the floating gate layer is divided over the remaining isolation structures 36B, and the dry etch-back process may be performed in a manner that the remaining isolation structures 36B are formed to a uniform thickness along the surface profile of the rounded active regions 30B.

Figure 7G:
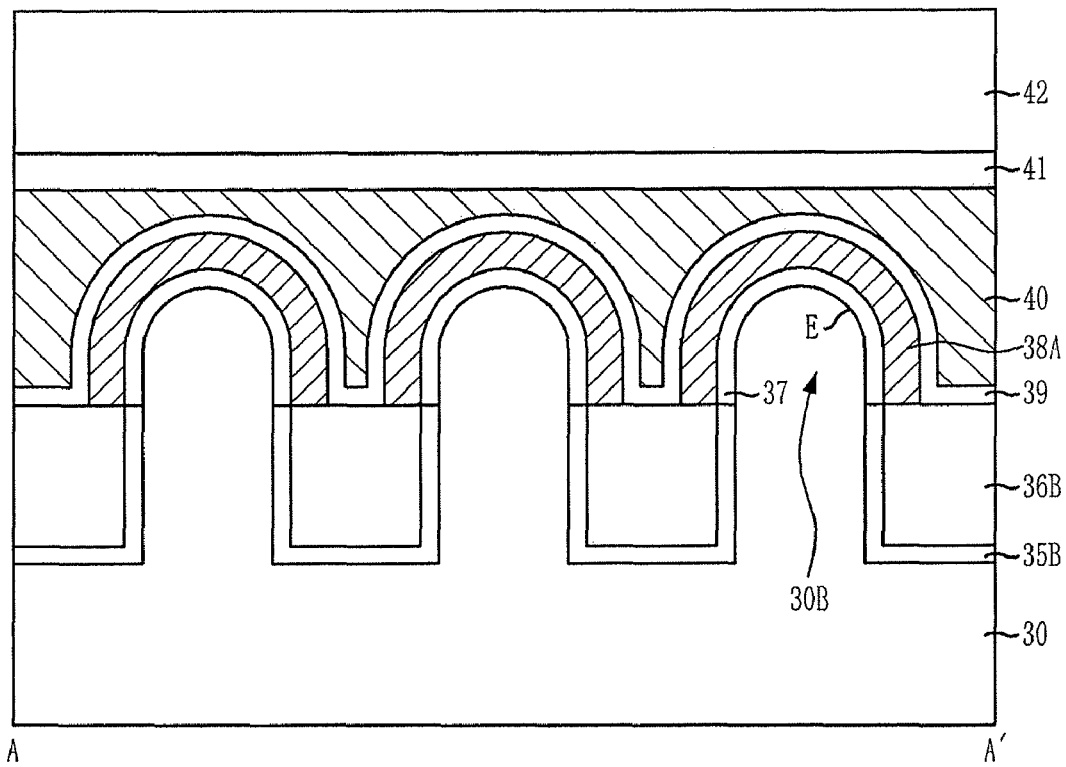
Figure 7H:
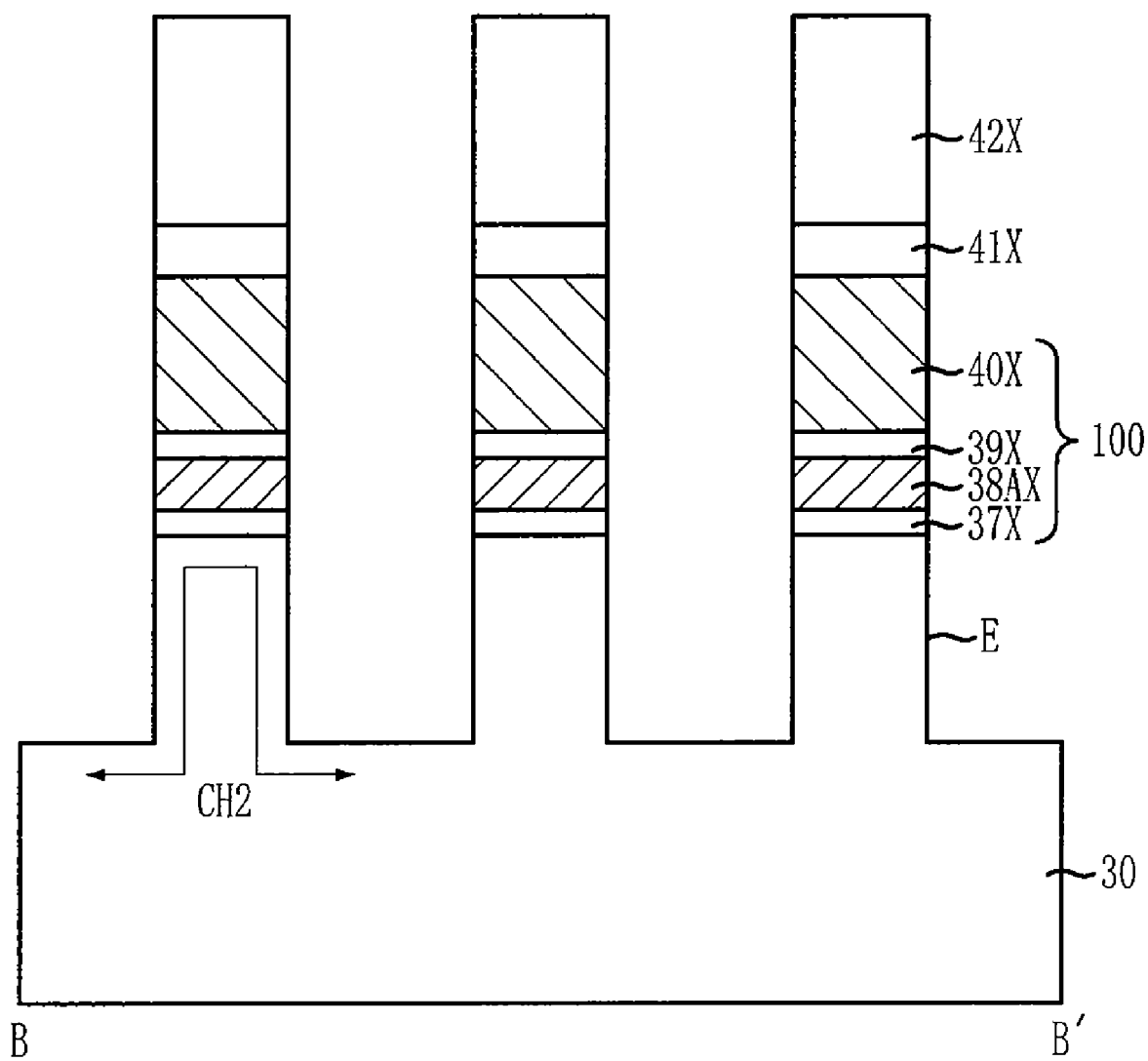

Referring to FIG. 7G, a dielectric layer 39 and a control gate layer 40 are formed over the remaining floating gate layers 38A. A SiON layer 41 and a hard mask layer 42 are formed over the control gate layer 40.

The dielectric layer 39 includes an oxide/nitride/oxide (ONO) structure. The ONO structure includes an oxide-based layer having a thickness ranging from approximately 30 Å to approximately 50 Å, a nitride-based layer having a thickness ranging from approximately 30 Å to approximately 50 Å, and an oxide-based layer having a thickness ranging from approximately 50 Å to approximately 70 Å.

The control gate layer 40 includes a stack structure. The stack structure includes a polysilicon layer having a thickness of approximately 2,000 Å and a tungsten silicide ($WSi_x$) layer having thickness ranging from approximately 1,000 Å to approximately 1,500 Å.

The SiON layer 41 is formed to a thickness ranging from approximately 200 Å to approximately 300 Å. The hard mask layer 42 includes an oxide-based layer having a thickness ranging from approximately 1,500 Å to approximately 2,000 Å.

Referring to FIG. 7H, gate masks (not shown) are formed over the hard mask layer 42 in a direction perpendicular to the rounded active regions 30B. The hard mask layer 42 is etched using the gate masks as an etch mask. Thus, hard masks 42X are formed. A stack structure including the SiON layer 41, the control gate layer 40, the dielectric layer 39, and the remaining floating gate layers 38A is etched using the hard masks 42X. Thus, gates 100 are formed. The gates 100 include tunneling insulation patterns 37X, floating gates 38AX, dielectric patterns 39X, and control gates 40X. Reference numeral 41X represents SiON patterns 41X.

At this time, the lowest portions of the remaining floating gate layers 38A are formed on the remaining isolation structures 36B. Thus, the rounded active regions 30B projected above remaining isolation structures 36B have to be etched in order to etch the remaining floating gate layers 38A.

Therefore, the projected portions of the rounded active regions 30B remain only below the gates 100. Consequently, fin type protruding portions E are formed in the rounded active regions 30B. That is, the gates 100 are formed over the fin type protruding portions E of the rounded active regions 30B.

Figure 3:
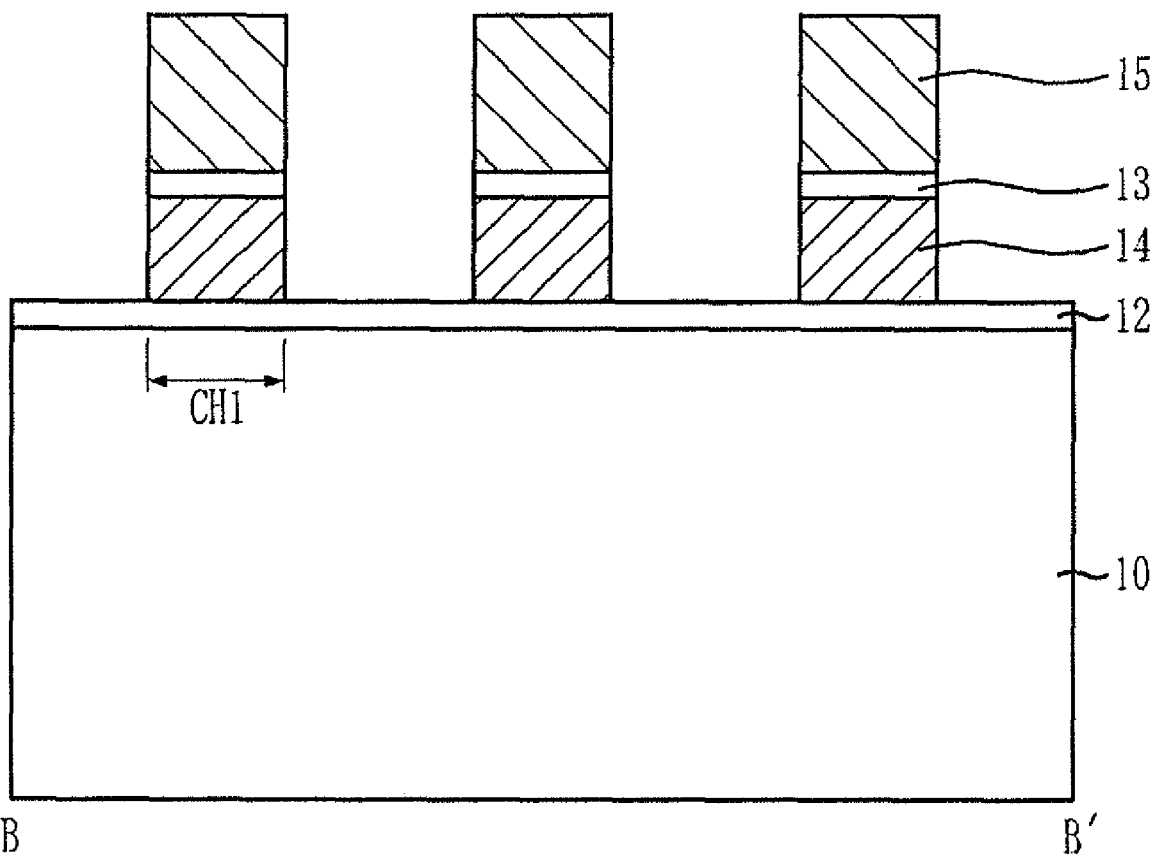
FIG. 3 illustrates a cross-sectional view of the nonvolatile memory device shown in FIG. 1 in accordance with a line B-B'.

According to this embodiment, the gates 100 are formed over the fin type protruding portions E of the rounded active regions 30B, and the effective channel length CH2 is obtained by the rounded active regions 30B having the fin type protruding portions E. The effective channel length CH2 has an increased length by as much as the height of the protruding portions E of the rounded active regions 30B when compared to a typical effective channel length CH1 of a typical planar gate structure (shown in FIG. 3). The effective channel length CH2 is twice as large as the height of the protruding portions E of the rounded active regions 30B in essence.

In accordance with the embodiment of the present invention, the effective channel length is increased by forming the gates over the active regions including the fin type protruding portions. Thus, an electric characteristic of the device may be improved.

Also, the top corners of the protruding active regions are rounded so that electric fields strongly forming at the top corners of the active regions may be avoided. Thus, device characteristic deterioration due to concentrated electric fields may be reduced.

Furthermore, the floating gates are formed to a uniform thickness along the rounded surface profile of the protruding active regions. Thus, charge density and electric fields may be uniformly maintained, maximizing fin type channel efficiency.

While the present invention has been described with respect to the specific embodiments, it will be apparent to those skilled in the art that various changes and modifications may be made without departing from the spirit and scope of the invention as defined in the following claims.

What is claimed is:

1. A nonvolatile memory device, comprising:
   a control gate formed along a first direction over a substrate;
   an active region formed over the substrate, the active region being defined along a second direction crossing the control gate and including a fin type protruding portion having rounded top corners at a region where the control gate and the active region overlap;
   a floating gate formed over a surface of the protruding portion of the active region below the control gate and formed to a substantially uniform thickness along the surface profile of the protruding portion of the active region;
   a tunneling insulation layer formed between the floating gate and the active region; and
   a dielectric layer formed between the floating gate and the control gate.

2. The nonvolatile memory device of claim 1, further comprising an isolation structure formed along a direction crossing the control gate, the isolation structure being configured to insulate adjacent floating gates provided below the control gate.

3. The nonvolatile memory device of claim 1, wherein the floating gate comprises a polysilicon layer and the control gate comprises a stack structure including a polysilicon layer and a tungsten silicide layer.

4. The nonvolatile memory device of claim 1, wherein the fin type protruding portion is formed to a height ranging from approximately 500 Å to approximately 1,500 Å.

5. A method for fabricating a nonvolatile memory device, comprising:
   forming isolation structures to define active regions;
   recessing portions of the isolation structures so that the active regions protrude above the isolation structures;
   rounding top corners of the protruding active regions;
   forming tunneling insulation layers over surfaces of the protruding active regions;
   forming floating gate layers to a substantially uniform thickness over the tunneling insulation layers along the surface profile of the protruding active regions;
   forming a dielectric layer and a control gate layer over a substrate structure;
   forming gate masks over the control gate layer along a direction crossing the active regions; and
   etching the control gate layer, the dielectric layer, the floating gate layers, the tunneling insulation layers, and the protruding active regions using the gate masks, exposing the recessed isolation structures, to form protruding fin type active regions and form gates over the protruding fin type active regions, wherein etching the control gate layer, the dielectric layer, the floating gate layers, the tunneling insulation layers, and the protruding active regions to form the gates comprises:
  forming a silicon oxynitride (SiON) layer over the control gate layer;
  forming a hard mask layer over the SiON layer;
  forming a control gate mask over the hard mask layer;
  patterning the hard mask layer; and
  etching the SiON layer, the control gate layer, the dielectric layer, the floating gate layers, the tunneling insulation layers, and the protruding active regions using the patterned hard mask layer.

6. The method of claim 5, wherein recessing the portions of the isolation structures comprises using a dry etch process.

7. The method of claim 5, wherein the recessed thickness of the isolation structures ranges from approximately 500 Å to approximately 1,500 Å.

8. The method of claim 5, wherein forming the floating gate layers comprises:
  forming a conductive layer over the recessed isolation structures and the tunneling insulation layers;
  forming a photoresist pattern covering portions of the conductive layer formed over the active regions and portions of the recessed isolation structures adjacent to the active regions;
  etching portions of the conductive layer using the photoresist pattern in a manner that the etched conductive layer remains over the recessed isolation structures with a certain thickness;
  removing the photoresist pattern; and
  performing an etch-back process on the etched conductive layer to form the floating gate layers isolated over the recessed isolation structures and having a substantially uniform thickness along the surface profile of the protruding active regions.

9. The method of claim 8, wherein the conductive layer comprises a polysilicon layer having a thickness ranging from approximately 1,500 Å to approximately 2,000 Å.

10. The method of claim 8, wherein etching the portions of the conductive layer comprises a etch target thickness ranging from approximately 500 Å to approximately 1,000 Å.

11. The method of claim 8, wherein performing the etch-back process comprises using a fluorine-based gas as an etchant.

12. The method of claim 11, wherein the fluorine-based gas comprises tetrafluoromethane ($CF_4$), hexafluoroethane ($C_2F_6$), octafluorocyclobutane ($C_4F_8$), $C_4F_6$, $C_5F_8$, fluoroform ($CF_3H$), difluoromethane ($CF_2H_2$), methyl fluoride ($CFH_3$), pentafluoroethane ($C_2HF_5$), nitrogen trifluoride ($NF_3$), sulfur hexafluoride ($SF_6$), chlorotrifluoromethane ($CF_3Cl$), or a combination thereof.

13. The method of claim 11, wherein hydrogen ($H_2$) or oxygen ($O_2$) is added to the fluorine-based gas.

14. The method of claim 5, wherein forming the floating gate layers comprises:
  forming a conductive layer over the recessed isolation structures and the tunneling insulation layers;
  forming a photoresist pattern covering portions of the conductive layer formed over the active regions and portions of the recessed isolation structures adjacent to the active regions;
  etching the conductive layer to expose the recessed isolation structures using the photoresist pattern, forming isolated floating gate layers over the recessed isolation structures;
  removing the photoresist pattern; and
  performing an etch-back process on the isolated floating gate layers to form the floating gate layers having a uniform thickness along the surface profile of the protruding active regions.

15. The method of claim 14, wherein the conductive layer comprises a polysilicon layer having a thickness ranging from approximately 1,500 Å to approximately 2,000 Å.

16. The method of claim 14, wherein performing the etch-back process comprises using a fluorine-based gas as an etchant.

17. The method of claim 9, wherein the fluorine-based gas comprises $CF_4$, $C_2F_6$, $C_4F_8$, $C_4F_6$, $C_5F_8$, $CF_3H$, $CF_2H_2$, $CFH_3$, $C_2HF_5$, $NF_3$, $SF_6$, $CF_3Cl$, or a combination thereof.

18. The method of claim 9, wherein $H_2$ or $O_2$ is added to the fluorine-based gas.

19. The method of claim 5, wherein forming the isolation structures comprises:
  forming a trench mask over the substrate;
  etching the substrate to a certain depth using the trench mask to form trenches defining the active regions;
  forming a gap-fill insulation layer until the trenches are filled, the gap-fill insulation layer being used for forming the isolation structures over the substrate structure;
  planarizing the gap-fill insulation layer until surfaces of the trench mask are exposed; and
  removing the trench mask.

20. The method of claim 19, wherein planarizing the gap-fill insulation layer comprises performing a first chemical mechanical polish (CMP) process using silica slurry and a second CMP process using ceria slurry.

21. The method of claim 19, wherein forming the trench mask comprises forming an oxide-based layer and a nitride-based layer.

22. The method of claim 21, wherein removing the trench mask comprises:
  removing the gap-fill insulation layer remaining over the trench mask after the gap-fill insulation layer is planarized; and
  removing the nitride-based layer of the trench mask.

23. The method of claim 22, wherein removing the gap-fill insulation layer comprises dipping the gap-fill insulation layer in a buffered oxide etchant (BOE) solution, and wherein removing the nitride-based layer comprises using phosphoric acid ($H_3PO_4$) solution.

24. The method of claim 5, wherein forming the control gate layer comprises forming a polysilicon layer and a tungsten silicide layer.

* * * * *